United States Patent [19]

Nakase et al.

[11] Patent Number: 5,222,035
[45] Date of Patent: Jun. 22, 1993

[54] DIGITAL FILTER CIRCUIT

[75] Inventors: Junko Nakase, Hachiouji; Hirotsugu Kojima, Nerima, both of Japan

[73] Assignee: Hitachi, Ltd., Chiyoda, Japan

[21] Appl. No.: 706,389

[22] Filed: May 28, 1991

[30] Foreign Application Priority Data

May 28, 1990 [JP] Japan .................. 2-135199

[51] Int. Cl.$^5$ .............................................. G06F 15/31
[52] U.S. Cl. .................................................. 364/724.16
[58] Field of Search ...................... 364/724.01, 724.13, 364/724.16, 757

[56] References Cited

U.S. PATENT DOCUMENTS

| | | | |
|---|---|---|---|
| 4,323,980 | 4/1982 | Houdard et al. | 364/724.13 |
| 4,484,299 | 11/1984 | Lambourn et al. | 364/724.16 |
| 4,618,941 | 10/1986 | Linder et al. | 364/724.16 |
| 4,644,488 | 2/1987 | Nathan | 364/757 |
| 4,802,111 | 1/1989 | Barkan et al. | 364/724.13 |
| 5,050,119 | 9/1991 | Lish | 364/724.13 |

FOREIGN PATENT DOCUMENTS 63-1258  1/1988  Japan .

OTHER PUBLICATIONS

Wallace, "A Suggestion for A Fast Multiplier", IEEE Trans. on Electronic Computers, vol. 13, No. 1, Feb. 1964, pp. 14–17.

*Primary Examiner*—Long T. Nguyen
*Attorney, Agent, or Firm*—Antonelli, Terry, Stout & Kraus

[57] ABSTRACT

When each sample is expressed by digital signals of 8 bits, 8 bits constituting each of the digital signals are divided into data of upper 5 bits including the most significant bit, and data of lower 4 bits including the least significant bit. These two data are respectively inputted to two filter circuit units, and are simultaneously subjected to a filtering process separately. Outputs of these two filter circuit units are inputted to an adder. In the adder, the output of the filter circuit unit being data of upper 5 bits subjected to a filtering process is weighted by a factor of 2 to the 4th power, and the weighted output is added to the output of the other filter circuit unit. The results of adding are outputted from the adder as signals obtained by the original digital signals of 8 bits subjected to the filtering process. Since the number of bits of individual data is made small by the division, the operation speed of computing elements and the number of times of recursive or multiple uses of computing elements are increased so that the circuit scale of the entire filter circuit can be reduced.

21 Claims, 12 Drawing Sheets

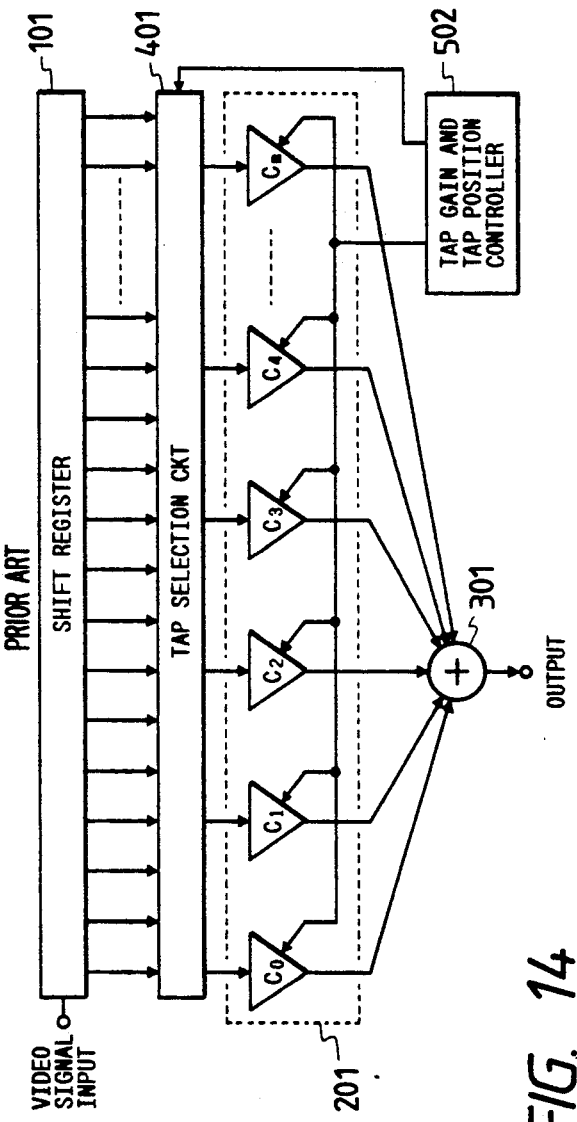
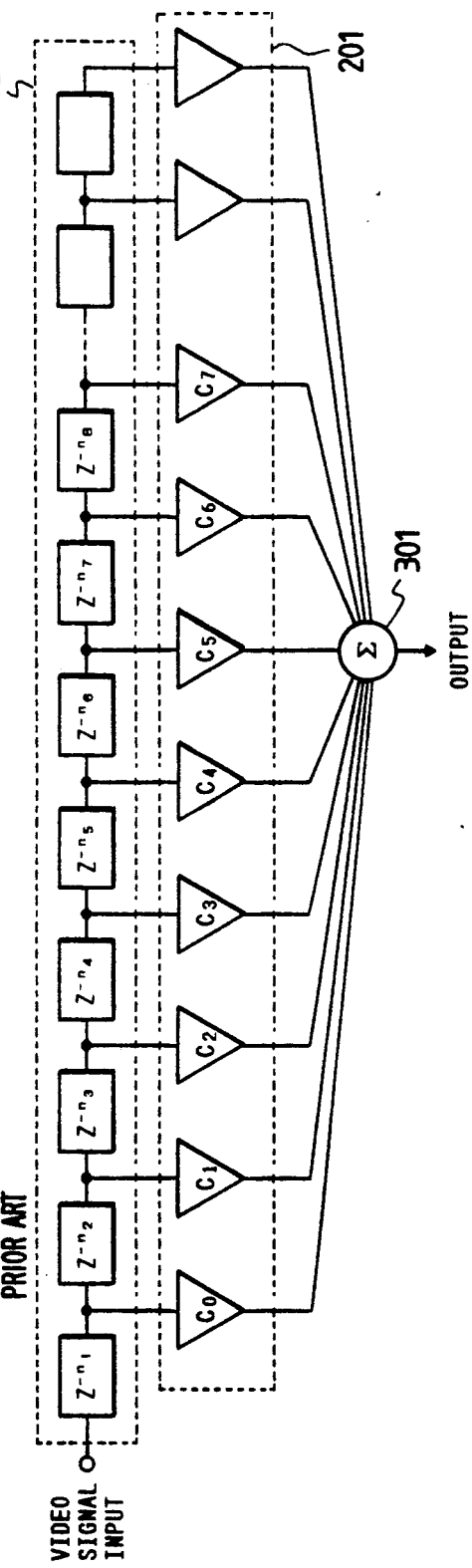

DIGITAL FILTER CIRCUIT

BACKGROUND OF THE INVENTION

The present invention relates to filter circuits for processing digital signals.

FIG. 2 shows a constitution of a transversal filter most used as a digital filter. The transversal filter in FIG. 2 comprises a device for delaying a signal, represented by a shift register 11, a plurality of multipliers 31 for, multiplying output signals of respective stages of the shift register 11 being different in a delay time (in FIG. 2, $Z^{-1}$ indicates a unit delay time) by tap gains $C_0$, $C_1$, $C_2$, ..., $C_n$ respectively corresponding to the stages of the shift register 11, and an adder 41 for obtaining a sum of outputs of the multipliers 31. The plurality of multipliers 31 are put together and represented as a multiplier group 310. Besides this, various digital filters are known to perform signal processing by a combination of delay, multiplication and addition. In the factoring description, such a process of delay, multiplication and addition to input signals performed by the digital filter is called a filtering process.

A sampling frequency fs at which a video signal is sampled, for example, in the case of the NTSC system, is 14.3 MHz being four times of a color subcarrier frequency fsc. Then, a sampling interval (=1/fs) becomes 70 ns. That is, when the above-mentioned transversal filter is constituted in the video signal band, a next signal appears every 70 ns at each stage of the shift register 11.

On the other hand, with the development of semiconductor circuit technique, computing elements such as an adder, a multiplier or the like have been significantly improved in an operation speed. For example, a multiplier of 8 bits×8 bits in 8 ns can be realized.

The transversal filter in FIG. 2 is provided with one multiplier for each tap. If the above-mentioned filter is used, it takes only 8 ns from the determination of signals of each stage of the shift register 11 to the output of the multiplication result, and since all multipliers are not operated during a period of 62 ns until a next signal appears in each stage, such a transversal filter is not efficient.

To solve this problem, recursive operation of the computing element as disclosed in the Japanese Patent Application Laid-open No. 63-1258 has been proposed. The computing element is operated at the frequency of n times the sampling frequency of the input signal, thereby the operation for n data will be processed by one computing element for one sampling interval. The scale of the circuit would be reduced because of replacement of n computing elements by one computing element.

SUMMARY OF THE INVENTION

In the above-mentioned multiple system in the prior art, the number of multiplexing is specified by the operation speed of the computing element depending on the performance of the device only. According to this, there is a problem that the reduction of the circuit scale is not satisfactory for the above reason.

An object of the present invention is to improve the number of multiplexing further by the circuit technique and to provide a filter circuit having a smaller circuit scale than that of the above example in the prior art.

To achieve the above object, in the present invention, a filter circuit is constituted by a plurality of filter circuit units and an adder taking the sum total of their respective outputs, and the input digital signals are divided into data of some bits and each data is processed in parallel by means of separately equipped filter circuit units respectively.

DETAILED DESCRIPTION OF THE INVENTION

Because of division of input signals into a plurality of data, the number of bits of individual data becomes less than that before the division, and both the operation time and the circuit scale of individual multipliers can be reduced in individual filter circuit units processing each data. Therefore, since the number of times of recursive or multiple uses of computing elements including a multiplier and an adder can be raised, the number of the computing elements can be further reduced, and as a result, the circuit scale of the entire filter circuit can be reduced. This operation will be explained as follows.

Now, an example of dividing an input signal of binary coded 8 bits into two parts will be explained. Time series input and output of the filter are made a, b respectively, and a transfer function intended to be realized at the filter is made H(z). Where $a_1$, $a_2$ are made upper 4 bits and lower 4 bits of a respectively, and a is expressed as follows.

$$a = 2^4 a_1 + a_2$$

Input and output data a and b of the filter are developed using a transfer function H(z) as follows.

$$\begin{aligned} b &= H(z)a \\ &= H(z)(2^4 a_1 + a_2) \\ &= 2^4 H(z)a_1 + H(z)a_2 \end{aligned}$$

In the present invention, $b_1$ and $b_2$ are searched by two filters which have transfer functions H(z), as $$b_1 = H(z)a_1$$

$$b_2 = H(z)a_2,$$

and the desired output b can be obtained by addition of $$b = 2^4 b_1 + b_2$$

Such consecutive processings are carried out in that the inputs $a_1$, $a_2$ are subjected to a filtering process by two filters having the same transfer characteristics, and then the value of output $b_1$ weighted by $2^4$ and the output $b_2$ are added to each other. Further, as multiplication of 2 in binary number is equivalent to shifting to a place of binary digit by one upper digit, weighting by $2^4$ can be processed by connection in shifting by 4 bits.

The above processes can be extended to the case in which input a of plural bits is divided into m parts when such a filter for outputting output b to input a is realized.

Now, m data obtained by dividing the input a in the intervals of some bits (it is not necessary to divide equally) according to the order from upper (or lower) bits are made $a_1 - a_m$. To obtain the desired output b at this time, like the case of dividing into 2, in a plurality of filter circuit units having the same transfer characteristics (tap gain for output of every stage of shift registers is equal), the filtering process is performed for each data, and those filter outputs $b_l$–$b_m$ each may be weighted according to respective inputs and be summed up. In the case that respective divided data are equal in the number of bits, all data can be processed by the filter circuit units having the same constitution.

BRIEF DESCRIPTION OF THE DRAWINGS

In the accompanying drawings:

FIG. 13 is a block diagram showing an improved filter circuit for ghost canceler in the prior art;

FIG. 14 is a block diagram showing an equivalent circuit of the circuit in FIG. 13;

DETAILED DESCRIPTION OF EMBODIMENTS

Figure 1:
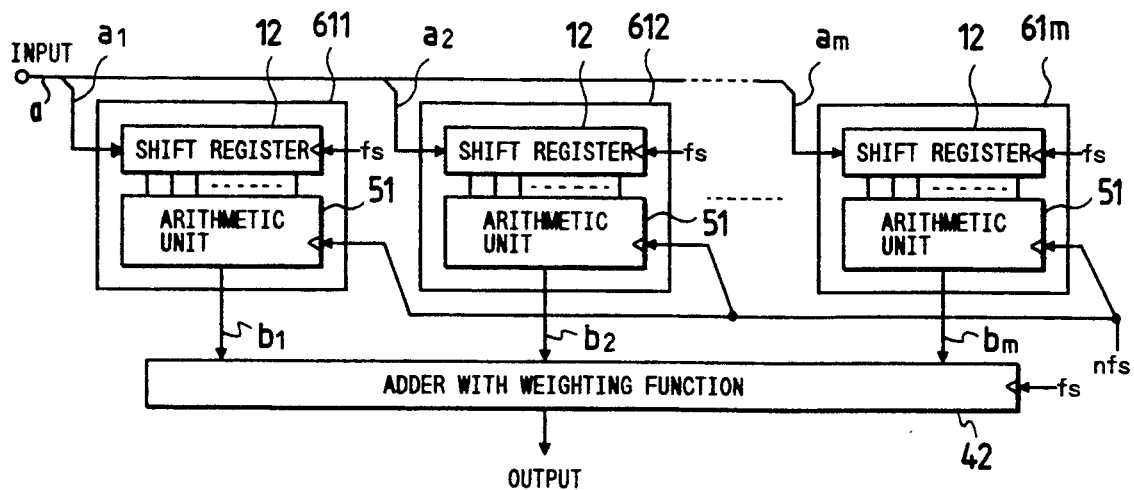
FIG. 1 is a block diagram showing a filter circuit according to a first embodiment of the invention.

FIG. 1 shows a first embodiment of the invention. The filter circuit in FIG. 1 comprises m filter circuit units 611, 612, ..., 61m, and an adder with weighting function 42 which weights outputs $b_1, b_2, ..., b_m$ of the filter circuit units 611, 612, ..., 61m by a factor corresponding to respective places of binary digits and then sums up the weighted outputs. Each filter circuit unit 611, 612, ... or 61m is constituted by a shift register 12 and an arithmetic unit 51 which mainly performs multiplication and addition. The shift register 12 and the arithmetic unit 51 operate at fs and nfs respectively, where fs is a sampling frequency of a digital signal being inputted, and n is an integer with $n \geq 1$. To the shift register 12 of each filter circuit unit are inputted data $a_1, a_2, ..., a_m$ which have been produced by dividing a plurality of bits constituting the input digital signal a into a plurality of bit groups respectively.

The data $a_1, a_2, ..., a_m$ produced by dividing a plurality of bits constituting the input digital signal a into a plurality of bit groups are inputted to the shift register 12 of separate filter circuit units respectively. At the arithmetic unit 51 of each filter circuit unit, an operation of multiplying each corresponding tap gain to a plurality of output signals having different delay times of each stage of the shift register 12 and summing up the multiplication results is carried out n times ($n \geq 1$) in every one sampling interval ts ($=1/fs$). Every time the multiplication results are summed up for one sampling interval ts ($=1/fs$), the sum result is outputted from each filter circuit unit 61. Outputs of each arithmetic unit 51 are outputted as outputs $b_1, b_2, ..., b_m$ of respective filter circuit units 611, 612, ..., 61m, and are weighted according to the weight of each of input data $a_1, a_2, ..., a_m$ (a place of binary bit in the original signal a) of each filter circuit unit 61 and are summed up by the adder with weighting function 42, and the sum result is outputted as a filter circuit output in every sampling interval ts.

Next, a plurality of embodiments will be explained where the present invention is applied to a filter for ghost canceling of television signals. A filter for ghost canceling has quite many taps generally, and therefore demand of reduction of the circuit scale is very strong.

A television receiver receives direct waves from sending antennas of broadcasting stations and electromagnetic waves reflected by any object simultaneously. Therefore, interference called a ghost sometimes occurs in the received picture.

Figure 3:
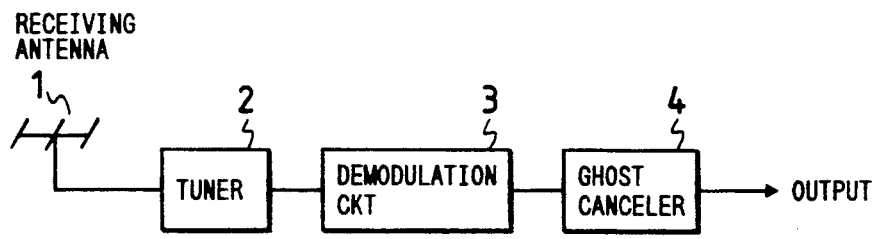
FIG. 3 is a block diagram showing a ghost canceler in a television receiver.
Figure 4:
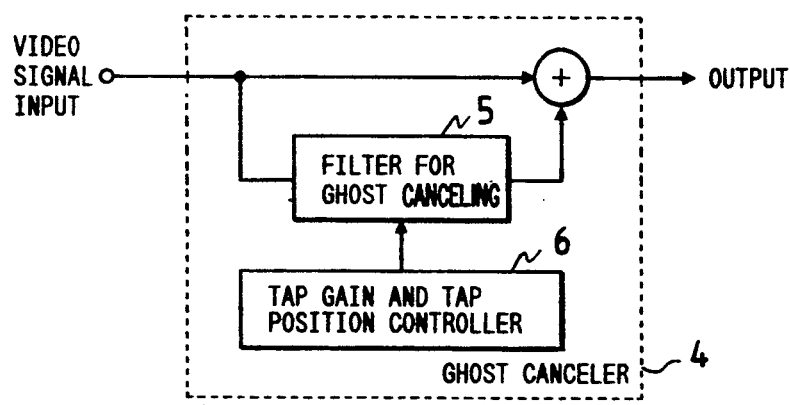
FIG. 4 is a block diagram showing a ghost canceler.

Conventionally, various kinds of ghost cancelers have been developed to cancel ghost as above described. FIG. 3 shows one example. Television signals are received by a receiving antenna 1, and signals of an optional channel are selected from the received television signals by a tuner 2 and demodulated by a demodulation circuit 3 and then ghost components are canceled by a ghost canceler 4. The ghost canceler 4 is constituted as shown in FIG. 4, and ghost canceling signals obtained by applying filtering to the input digital video signals in a filter for ghost canceling 5 are added to the original input digital video signals thereby ghost canceling is performed. Tap gain and tap position of the filter for ghost canceling 5 are controlled by a tap gain and tap position controller 6.

Figure 2:
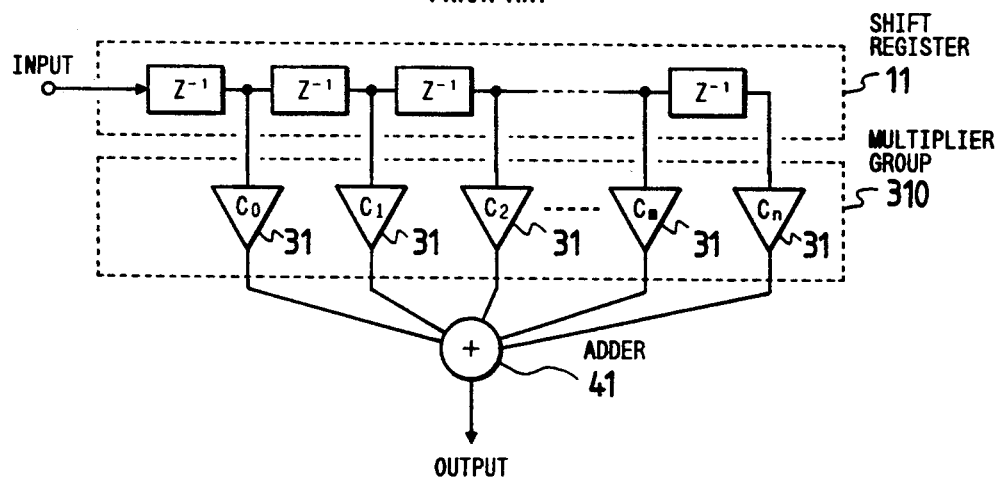
FIG. 2 is a block diagram of a transversal filter in the prior art.

As television signals received by the receiving antenna are a linear addition of direct waves and reflected waves, the transversal filter as shown in FIG. 2 may be used as a filter for ghost canceling. Accordingly, the filter circuit of the present invention can also be applied to the filter for ghost canceling.

It is necessary to constitute a transversal filter having several hundred taps in order to take measure against general ghost. But, in the filter for ghost canceling since almost all the tap gains for the output signals of each stage of the shift register are equal to zero practically, an operation need not be carried out for the output signals of all stages.

An embodiment of the present invention will now be described where a filter for ghost canceling having a maximum delay time of ghost being equal to 512 times of the sampling interval ts of the digital video signal and 128 taps has been manufactured.

Figure 5:
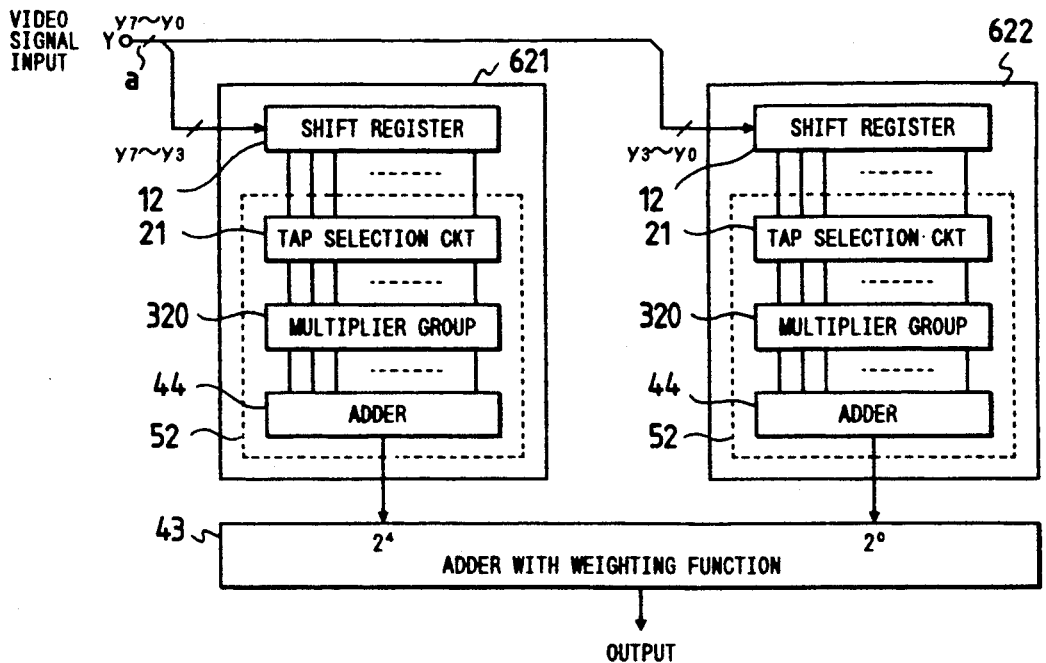
FIG. 5 is a block diagram showing a filter circuit according to a second embodiment of the invention.

FIG. 5 shows a second embodiment of the present invention. A filter circuit shown in FIG. 5 comprises two filter circuit units 621 and 622 for upper bits and lower bits of a digital video signal being composed of 8 bits, and an adder with weighting function 43 which weights outputs of the filter circuit unit 621 for upper bits by a factor of 2 to the 4th power and obtaining the sum total of outputs of both filter circuit units 621 and 622.

Each filter circuit unit 621 or 622 is composed of a shift register 12 and an arithmetic unit 52. The arithmetic unit 52 is constituted by a tap selection circuit 21 connecting a plurality of signal lines being taken out one by one from the outputs of each stage having different delay times of the shift register 12 to a multiplier group 320, the multiplier group 320 performing multiplication of a plurality of output signals of the tap selection circuit 21 by corresponding tap gains, and an adder 44 obtaining the sum total of a plurality of multiplication results of the multiplier group 320 and further summing up the sum total for one sampling interval ts. The multiplier group 320 is composed of a plurality of multipliers 32 (see FIG. 6).

Input video signals and each tap gain are binary numbers of 8 bits expressed in two's complement, and are processed as two data, digital video input signals being divided into upper 5 bits ($y_7$, $y_6$, $y_5$, $4_4$, $y_3$) and lower 4 bits ($y_3$, $y_2$, $y_1$, $y_0$). Signal $y_3$ of the fifth bit from the most significant bit is duplicated because it is necessary for processing both upper and lower bits. The reason for this will be described in detail later.

Although the multiplier of 8 bits×8 bits adopted in previous examples has a limit working frequency of 8 fs, it is possible for the multiplier 32 of 5 bits×8 bits in the present embodiment to be extended until 12 fs because of short operation word length. To deal with a ghost having the maximum delay time equal to 512 times the sampling interval and having a number less than 128 of taps of the filter necessary to remove it, the multipliers 32 are required in the number of (128 taps/12 times multiplexing=) 11. After all, when the multipliers 32 are provided in the number of 11, it follows that the present circuit can deal with taps in the number up to (11 multipliers×12 times multiplexing =)132. That is, the multiplier group 320 is an assembly of the multipliers 32 in the number of 11.

The tap selection circuit 21 is constituted by crossbar switches which select 55 lines (5 bits/multiplier×11 multipliers) connected to the multipliers 32 in the number of 11 among all output signal lines in the number of 2560 (5 bits/stage ×512 stages) of the shift register 12. The signal lines having outputs of different delay times of the shift register 12 are connected to the multiplier group 320 in every ts/12.

The eleven multipliers 32 constituting the multiplier group 320 perform the multiplication of respective inputted video signals by corresponding tap gains and output the multiplication results. The sum total of the above-mentioned multiplication results are calculated in every filter circuit unit 621 or 622 by the adder 44, and are summed up 12 times and then outputted as the filter circuit output.

As an algorithm applied to the multiplier 32 and the adder 44, a second-order Booth algorithm and a Wallace tree system are adopted, respectively. In this connection, the details of network constitutions will be explained as follows.

When an input video signal as multiplier is denoted by Y, as Y is represented by two's complement of 8 bits, Y is expressed as follows.

$$Y = -2^7 y_7 + 2^6 y_6 + 2^5 y_5 + 2^4 y_4 + 2^3 y_3 + 2^2 y_2 + 2^1 y_1 + 2^0 y_0$$

In this case, when a tap gain as multiplicand is denoted by X, a second order Booth algorithm being applied, the product P of X and Y is expressed by the sum of four partial products $pp_1 - pp_4$ as in the following equation.

$$P = XY = X(-2y_7 + y_6 + y_5)2^6 + X(-2y_5 + y_4 + y_3)2^4 + \quad (2)$$
$$X(-2y_3 + y_2 + y_1)2^2 + X(-2^0 y_1 + y_0)2^0$$
$$= 2^4(pp_1 + pp_2) + pp_3 + pp_4$$

where $$pp_1 = X(-2y_7 + y_6 + y_5)2^2 \quad (3)$$
$$pp_2 = X(-2y_5 + y_4 + y_3)2^0 \quad (4)$$
$$pp_3 = X(-2y_3 + y_2 + y_1)2^2 \quad (5)$$
$$pp_4 = X(-2^0 y_1 + y_0)2^0 \quad (6)$$

Next, equation (2) is divided into an upper partial product Ph and a lower partial product Pl, and is expressed as follows.

$$P = 2^4 Ph + Pl \quad (7)$$

where $$Ph = pp_1 + pp_2 \quad (8)$$
$$Pl = pp_3 + pp_4 \quad (9)$$

It is understood from equations (3)–(9) that in order to estimate the upper partial product Ph and the lower partial product Pl, the data of the multiplicand X and upper 5 bits of the multiplier Y, and the data of the multiplicand X and lower 4 bits of the multiplier Y are necessary respectively.

In the transversal filter in FIG. 2, if the output of the i-th multiplier multiplied by a coefficient Ci is denoted by Pi (where i=0, 1, 2, ..., n), like the above equation, Pi can be written as follows.

$$Pi = 2^4 Pih + Pil \quad (10)$$

Where Pih and Pil are an upper partial product and a lower partial product of the i-th multiplier respectively.

The output of the filter is obtained as a sum total of outputs of all multipliers, and it follows that $$\begin{aligned} S &= P_0 + P_1 + \ldots + P_n \quad (11) \\ &= (2^4 P_{0h} + P_{0l}) + (2^4 P_{1h} + P_{1l}) + \ldots + (2^4 P_{nh} + P_{nl}) \\ &= 2^4 (P_{0h} + P_{1h} + \ldots + P_{nh}) + (P_{0l} + P_{1l} + \ldots + P_{nl}) \\ &= 2^4 Sh + Sl \end{aligned}$$

where $$Sh = P_{0h} + P_{1h} + \ldots + P_{nh} \quad (12)$$
$$Sl = P_{0l} + P_{1l} + \ldots + P_{nl} \quad (13)$$

That is, it is understood that if the sum total Sh of the upper partial products Pih and the sum total Sl of the lower partial products Pil are obtained and Sh is multiplied by $2^4$ and then both are added to each other, the filter output S can be obtained.

In the filter circuit in FIG. 5, Sh and Sl can be obtained from the filter circuit units for upper bits and lower bits 621 and 622, respectively. To each shift register 12 the filter circuit units for upper bits and lower bits 621 and 622 are connected five signal lines $y_7$, $y_6$, $y_5$, $4_4$, $y_3$ and four signal lines $y_3$, $y_2$, $y_1$, $y_0$, respectively, among the eight signal lines $y_7$, $y_6$, $y_5$, $4_4$, $y_3$, $y_2$, $y_1$, $y_0$ of the input video signal a of 8 bits.

Figure 6:
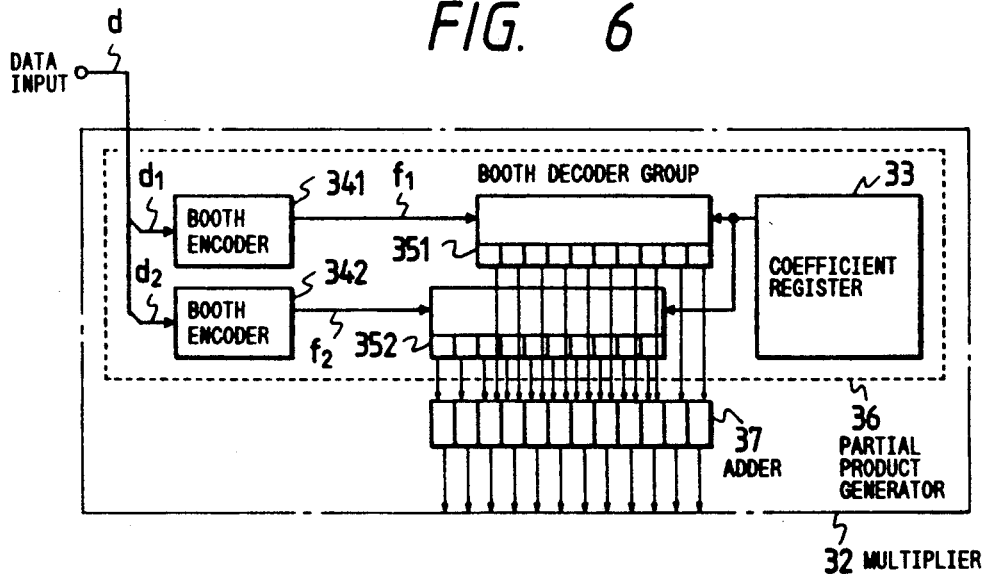
FIG. 6 is a block diagram showing an example of a multiplier used in the filter in FIG. 5.

One constitution example of a multiplier 32 constituting a multiplier group 320 being used for the filter circuit of FIG. 5 is shown in FIG. 6. The multiplier 32 comprises a partial product generator 36 and an adder 37. The partial product generator 36 is constituted by two Booth encoders 341, 342, Booth decoder groups 351, 352 at two stages, and a coefficient register 33 which stores tap gains for 12 taps. The sum total of outputs of the two-stage Booth decoder groups 351, 352 are obtained by the adder 37.

At each Booth encoder 341 or 342, Booth codes $f_1$, $f_2$ are produced respectively corresponding to the value in a parenthesis of the above coefficients $(-2y_7+y_6+y_5)-(-2^0 y_1+y_0)$ from data $d_1$, $d_2$ of 3 bits (or 2 bits) among data d of 5 bits (or 4 bits) being inputted from the tap selection circuit 21 to the multiplier 32. For example, at the filter circuit unit 621 for upper bits in FIG. 5, each 3 bits $y_5-y_3$, $y_7-y_5$ among 5 bits of $y_7-y_3$ are inputted to each Booth encoder 34, and Booth codes $f_1$, $f_2$ corresponding to $(-2y_5+y_4+y_3)$, $(-2y_7+y_6+y_5)$ are produced at the Booth encoders 341, 342 respectively. The Booth codes produced in the above-mentioned way are outputted to the corresponding Booth decoder groups 351, 352 respectively. At the Booth decoder groups 351, 352, tap gains of 8 bits read from the coefficient register 33 are transformed depending on the Booth codes from the Booth encoders 341, 342 and are outputted as partial products respectively.

At the adder 37, two partial products produced by the partial product generator 36 are added to each other considering respective weights, and are outputted as operation results of the multiplier 32.

At the adder 44 in FIG. 5, when the sampling interval of input video signals is denoted by ts, a sum of multiplication results outputted from the eleven multipliers 32 is sought every ts/12, and further twelve sums total sought in the interval ts are summed up.

It is recommended that a Wallace tree circuit be adopted for the addition performed every ts/12. The Wallace tree circuit is a circuit where tree is constituted for every bit with the reduction by a factor of 3 to 2 obtained by utilizing the three inputs and two outputs of a full adder, and the addition is performed by this constitution. This circuit has little propagation delay accompanying the addition, and therefore it is effective for the addition of multiple inputs.

In the addition of the adder 44 for every ts/12, data to be added to each other are eleven multiplication outputs, each being composed of 12 bits. Accordingly, data of the eleven multipliers are collected in every bit of 12 bits, and thereby a Wallace tree of eleven inputs is constituted. For the carry propagation accompanying the addition, a Wallace tree is constituted also concerning bits upper than the most significant bit of outputs of each multiplier. Such a constitution makes the operation time of the adder 44 reduced in comparison with system of adding eleven data of multiplication outputs in sequence and seeking for a sum total. A Wallace tree circuit is described in detail in C. S. Wallace, "A Suggestion for a Fast Multiplier", IEEE Transactions on Electronic Computers, Vol. 13, No. 1, February 1964, pp. 14–17.

Accumulation of twelve sums obtained for the interval ts in the adder 44 is carried out using an accumulator composed of an adder, an accumulation register and an output register.

Figure 7:
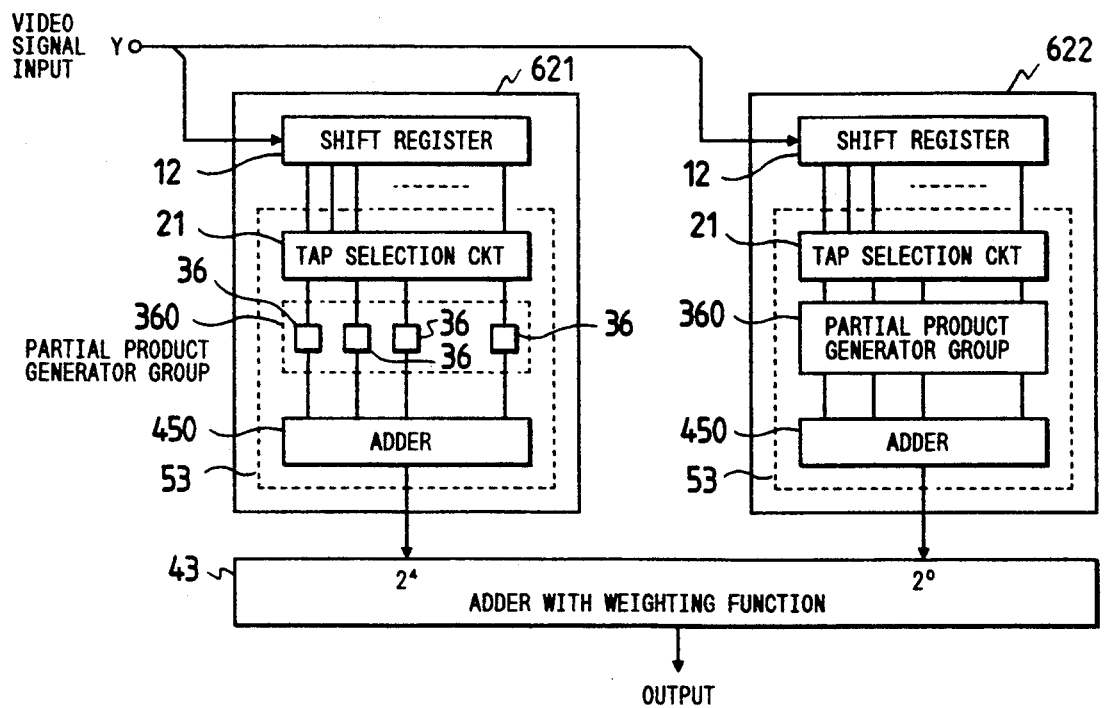
FIG. 7 is a block diagram showing a filter circuit according to a third embodiment of the invention.

FIG. 7 shows a third embodiment of the present invention. An arithmetic unit 53 of a filter circuit in FIG. 7 is constituted by a tap selection circuit 21, a partial product generator group 360, and an adder 450 comprising a Wallace tree group and an accumulator. At a multiplier group 320 of the above arithmetic unit 52, a Wallace tree group is constituted so as to collect data for every bit from 22 outputs of 10 bits of Booth decoder groups 351, 352 without summing up every individual multiplier 32. A sum of partial products outputted from the partial product generator group 360 is sought for every ts/12, and further the twelve sums for the ts interval are summed up by the accumulator. Being constituted in this way, the circuit scale and the operation time from the output of the partial product generator group 360 to output of each arithmetic unit can be reduced by 60%, 20% respectively in comparison with the above-mentioned constitution constituting a Wallace tree from the output of the multiplier 32. Accordingly, the above method is effective in constituting filter circuit units for upper bits and lower bits on the same chip.

The number of multipliers and the circuit scale of the adder are reduced by the multiple use of computing elements, and additionally multipliers of 8 bits $\times$ 8 bits are changed to multipliers of 8 bits $\times$ 5 bits, thereby the number of times of multiple use of computing elements can be raised from eight times to twelve times and further the circuit scale can be reduced.

Constituting the filter circuit as in the present embodiment, the circuit including one filter circuit unit 621 or 622 and an adder with weighting function 43 becomes to the scale which can be contained in one chip, and filter circuits can be realized in two chips.

Figure 8:
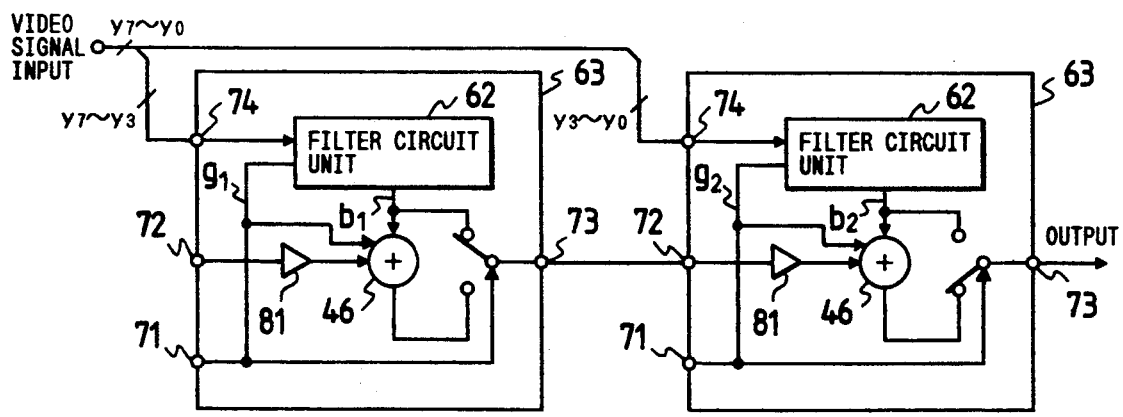
FIG. 8 is a block diagram showing a filter circuit according to a fourth embodiment of the invention.

A fourth embodiment of the present invention will be explained using FIG. 8. A filter circuit in FIG. 8 has been realized by two circuit blocks 63 of the same constitution in place of the filter circuits in FIG. 5. The circuit block 63 comprises a filter circuit unit 62 having the same constitution as the filter circuit unit 621 or 622 of FIG. 5, a shifter 81, and an adder 46. The shifter 81 realizes the weighting of 24 by a shift of 4 bits.

To use the same circuit block 63 commonly for upper bits and lower bits, the circuit block 63 has the adder 46 in order to seek for a sum of outputs of two filter circuit units 62 in addition to the above-mentioned shifter 81. Further, the circuit block 63 has a control terminal 71 for use of access of upper and lower positions, and an input terminal 72 receiving outputs of the filter circuit unit 62 of the other circuit block 63. Either output of the filter circuit unit 62 or output of the adder 46 can be selected as a signal outputted from an output terminal 73 to the outside, and the selection can be carried out by a control signal.

One example of the allotment of the circuit block 63 for upper bits or lower bits at the time of use will be explained. When the circuit block 63 is used for upper bits, input video signals $y_7-y_3$ are connected to a video signal input terminal 74 and a signal $g_1$ is inputted to the control terminal 71. Also when the circuit block 63 is used for lower bits, input video signals $y_3-y_0$ are connected to the video signal input terminal 74 and a signal $g_2$ is inputted to the control terminal 71.

Signal $g_1$ operates to disconnect the adder 46 and to connect the filter output $b_1$ to the output terminal 73. On the other hand, signal $g_2$ operates to give "0" input to the signal line of the least significant digit without input bits among the video signal input terminal 74 and to take a signal into the adder 46 through the shifter 81 from the input terminal 72, and also can be utilized as a control signal of the processing specific to lower bits such as the rounding up and down.

The above circuit block 63 can deal with the case of a video input signal having 4n bits (n=2, 3 . . . ). That is, a filter circuit having a video input signal of 4n bits and a tap gain of 8 bits can be implemented by n circuit blocks 63 being connected. In other words, the present invention provides a large effect that the filter having a large number of bits can be easily implemented only by using a plurality of the same circuit blocks 63.

When the circuit blocks 63 of three or more in number are connected, signal $g_1$ for the circuit block 63 to which the most significant bit data in inputted, signal $g_2$ for the circuit block 63 to which the least significant bit data is inputted, and signal $g_3$ for the circuit block 63 other than those mentioned above (for medium bits) are inputted to the respective control terminals 71, among the video input signals divided into each 5 bits (4 bits). The signal $g_3$ is a control signal equally working to the signal $g_2$, except for that the signal $g_3$ has no action for the shift register 12 such as processing of rounding up or down being specific to lower bits.

Thus three kinds of functions, for the most significant bit, the least significant bit and medium bits can be implemented in the same circuit block, thereby the development cost of the circuit block can be saved.

Figure 9:
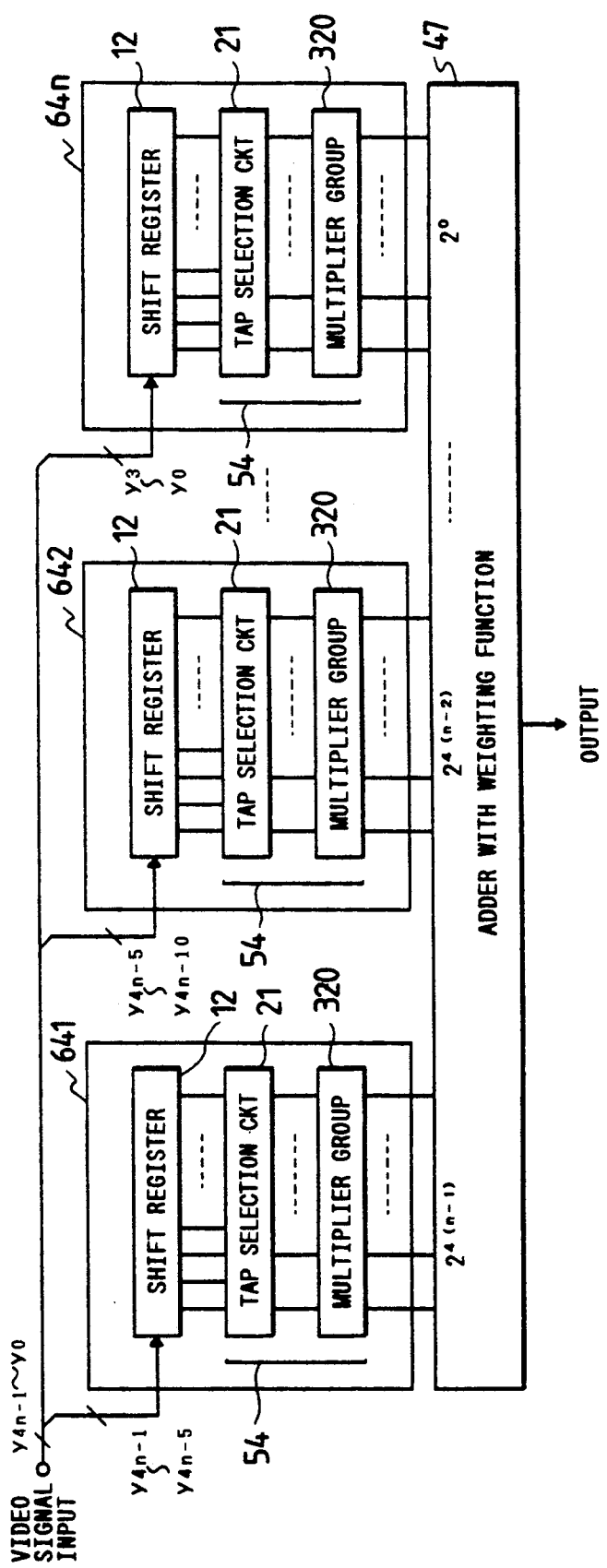
FIG. 9 is a block diagram showing a filter circuit according to a fifth embodiment of the invention.

FIG. 9 shows a fifth embodiment of the present invention. A filter circuit in FIG. 9 comprises n filter circuit units 641, 642, . . . , 64n, and an adder with weighting function 47 which obtains a sum of their outputs. Each filter circuit unit 641, 642, . . . or 64n is composed of a shift register 12 and an arithmetic unit 54. The arithmetic unit 54 is constituted by a tap selection circuit 21 used in the first embodiment and a multiplier group 320, and operates like the second embodiment. The multiplier group 320 contains eleven multipliers 32.

This filter circuit is provided with the n filter circuit units thereby can deal with the case that input signal is of 4n bits (n=2, 3 . . . ). The input signal in every 4 bits (or 5 bits) is inputted to each separate filter circuit unit 641, 642, . . . or 64n. At this time, the adder with weighting function 47 composes a Wallace tree for each bit from multiplication results of a total 11n multipliers possessed by the n filter circuit units 641, 642, . . . , 64n, and can obtain a sum of the multiplication results of all filter circuit units. Further, the adder with weighting function 47 contains an accumulator which has a function of summing up the sum total in twelve times of the multiplication results of the full filter circuit unit which can be obtained for a period of one sampling interval ts.

Figure 10:
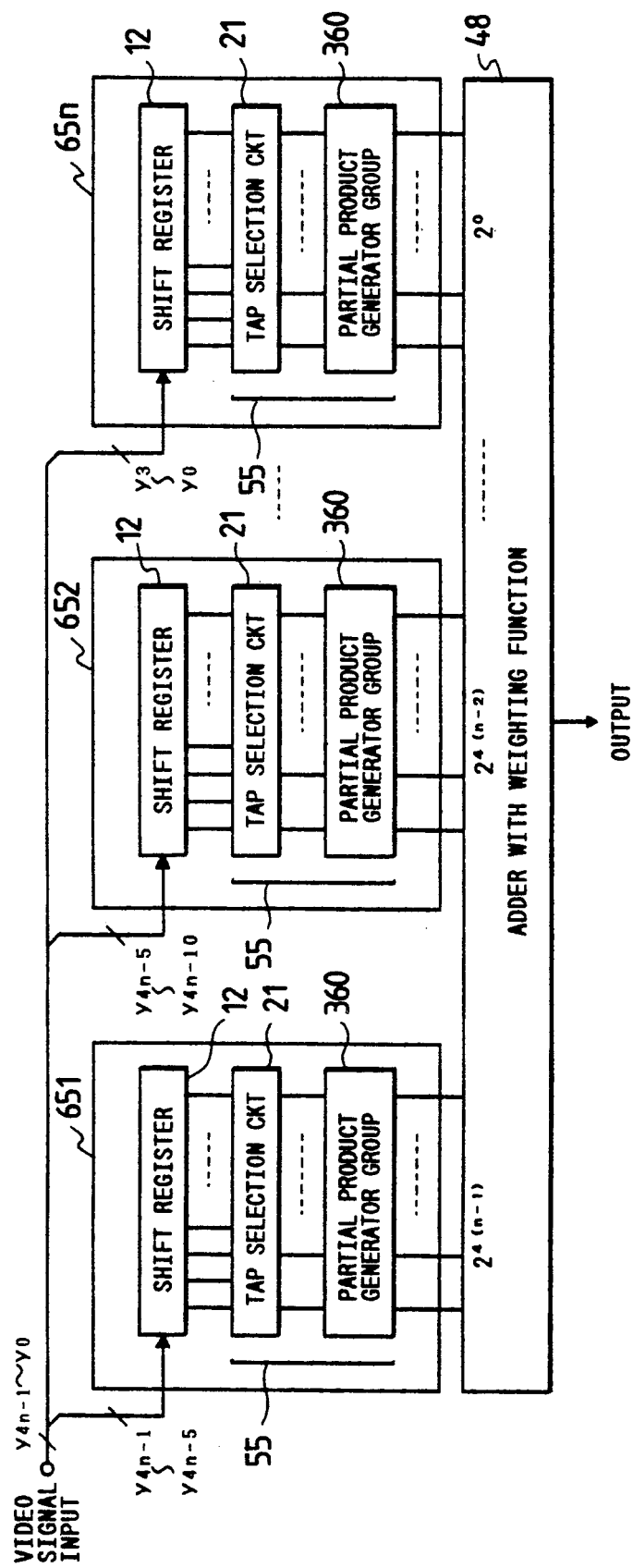
FIG. 10 is a block diagram showing a filter circuit according to a sixth embodiment of the invention.

FIG. 10 shows a sixth embodiment of the present invention. In the fifth embodiment (FIG. 9), the multiplier group 320 in each filter circuit unit 641, 642, . . . or 64n is composed of the eleven multipliers 32. This multiplier 32 is composed of the partial product generator 36 and the adder 37 as shown in FIG. 6. Therefore, integrating the adder 37 behind the partial product generator 36 within the multiplier group in each filter circuit unit, an adder with weighting function 48 may be constituted. One adopting this constitution is the sixth embodiment shown in FIG. 10.

A filter circuit in FIG. 10 comprises n filter circuit units 651, 652, . . . , 65n, and an adder with weighting function 48. The filter circuit unit is such that the multiplier group 320 in the arithmetic unit 54 of the filter circuit unit in FIG. 9 is replaced by a partial product generator group 360. Data of the same digit are collected from outputs of a plurality of partial product generators 36 through all filter circuit units 651, 652, . . . , 65n, under consideration of each weight of output of each filter circuit unit, and a Wallace tree is constituted for every digit. Further, an accumulator having an accumulating function for one sampling interval ts like the adder with weighting function 47 in FIG. 9 the Wallace tree adders constituted in such a way. If the filter circuits are constituted in such a way, the circuit scale of the entire filter circuit and the operation time can be reduced significantly. Also the larger the number n of the filter circuit units 651, 652, . . . , 65n, the more effectively this effect acts.

Figure 11:
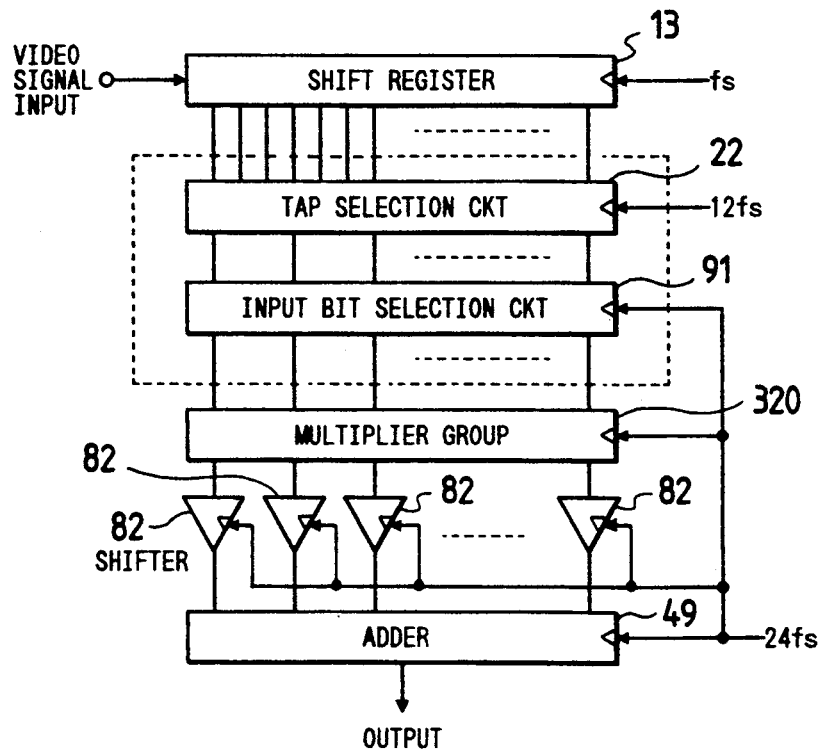
FIG. 11 is a block diagram showing a filter circuit according to a seventh embodiment of the invention.

FIG. 11 shows a seventh embodiment of the present invention. The case of an input video signal being binary 8 bits will be explained. A filter circuit in FIG. 11 is provided with a tap selection circuit 22 and an input bit selection circuit 91 between a shift register 13 and a multiplier group 320. Shifters 82 each of 4 bits only operating at the time of outputting multiplication results of upper digits are connected respectively to a plurality of outputs of the multiplier group 320. Outputs of each shifter 82 are added by an adder 49, and results of the addition are summed up for one sampling interval ts. The tap selection circuit 22 is such that the above-mentioned tap selection circuit 21 supplying signal of 5 bits to the multiplier group is extended so as to supply signal of 8 bits. Also the shift register 13 has a delay line for 8 bits, and the video input signal of 8 bits is connected thereto.

The tap selection circuit 22 operates at 12fs (fs is a sampling frequency of the input video signal). On the other hand, the input bit selection circuit 91, the multiplier group 320 and the adder 49 together operate at the frequency 24 fs which is twice the frequency of the tap selection circuit 22. The input bit selection circuit 91 connects upper 5 bits and lower 4 bits among the input video signal of 8 bits, each for an interval of ts/24, to the multiplier group 320 for the interval of ts/12 until the tap selection.

An upper partial product and a lower partial product are outputted alternately every ts/24 in the multiplier group 320. The adder 49 calculates a sum of outputs of the multiplier group 32 sequentially, and sums up the results 24 times for a sampling interval ts. The summation results are outputted as a filter circuit output every ts. This is equal to a filter circuit output when the multiplexing has been performed 12 times at the filter circuit provided with the multiplier of 8 bits×8 bits.

In the filter circuit of this embodiment, a constitution provided with the above-mentioned partial product generator group 360 may be taken in place of the multiplier group 320.

Figure 12:
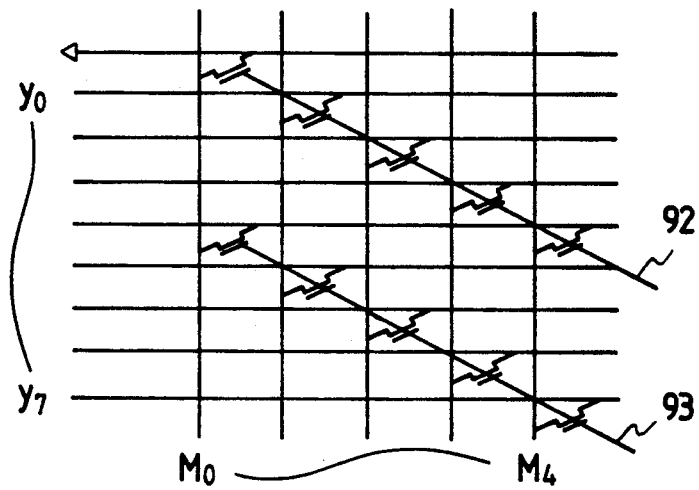
FIG. 12 is a circuit diagram showing an example of an input bit selection circuit used in the filter circuit in FIG. 11.

FIG. 12 shows one example of constitution of the input bit selection circuit 91. The circuit in FIG. 12 is constituted by crossbar switches selecting five lines from nine signal lines being composed, of eight video input signal lines $y_0 - y_7$ and one grounding line to be added, and connecting the selected lines to signal lines Mo–M4. Where Mo–M4 are signal lines connected to the multiplier. Each switch is controlled by signals inputted from signal lines 92, 93. The circuits in FIG. 12 are provided by the number equal to that of the multipliers, thereby the input bit selection circuit 91 can be constituted.

The circuits in FIG. 12 are provided by the number of (all stage number of the shift register 13)×(number of the multipliers 32), i.e., (511×11=) 5632 so as to constitute the crossbar switches, thereby the functions of the tap selection circuit 22 and the input bit selection circuit 91 can be implemented simultaneously.

This embodiment can be extended to the case where an input signal is of 4n bits (n=2, 3 . . . ). This case can be implemented in that the input bit selection circuit 91 selecting and connecting two data is replaced by a bit selection circuit selecting and connecting n data, and further the shifter 82 of 4 bits by a shifter whose shift quantities can be selected to 4k bits ($k=1-(n-1)$). In this case, the bit selection circuit, the multiplier group 320, the 4k-bit shifter and the adder 49 operate all at the frequency of 12nfs.

The same filter circuit is used in the time sharing with n data which are obtained by the division of digital signals of 4n bits, as indicated in the present embodiment, thereby the circuit scale of the multiplier and the adder part can be extremely reduced.

According to the above-mentioned embodiment, as video input signals are divided into a plurality of data, the number of bits of individual data becomes smaller than that before the division, thereby both the operation time and the circuit scale of the individual multipliers in the individual filter circuits (units) processing each data can be reduced. Therefore, as the number of times of multiplexing use computing elements including multipliers and adders can be raised, the number of the computing elements can be further reduced, and as a result, the circuit scale of the entire filter circuit can be reduced. This effect especially contributes to the digital filter having a large number of taps, such as a filter for ghost canceling. Further, constituting the filter circuit unit as circuit blocks which can be commonly used at each bit, the filter circuit having a large number of input bits can be easily constituted by using a plurality of circuit blocks.

When the filter in the prior art shown in FIG. 2 is used as a filter for ghost canceling of a television receiver, as the tap number reaches several hundreds, the circuit scale becomes very large. For example, when a delay time corresponding to the 256 picture elements (256 times the sampling interval) is expected, the delay elements, the multipliers and the adders must be provided each by the number of 256. Improving this, when a tap selection circuit 401 is installed as shown in FIG. 13, the number of the multipliers to be required can be reduced to about 64. However, while it is difficult to integrate the multipliers as many as 64 on one chip of LSI, even if implementation by using a plurality of chips is intended, the number of signal lines connecting between chips will become enormous and difficulties will occur. For example, if an input signal has an accuracy of 8 bits, the tap selection circuit becomes a selector circuit obtaining an output signal of 512 lines (8 bits×64) from an input signal of 2048 lines (8 bits×256). Even if this is intended to be divided into different LSI chips on the way, it is not feasible because output terminals and control terminals corresponding to the number of the multipliers connected to input terminals for 2048 lines are required.

In the present invention, multiplication for a plurality of taps is carried out using one multiplier in time sharing and those results are summed up, thereby a signal for ghost canceling is obtained. Since the computing element is used in time sharing, the scale of the arithmetic circuits is significantly reduced.

In a filter circuit for ghost canceling shown in FIG. 13, a part of a shift register 101 and a tap selection circuit 401 can be treated as a variable delay line 102 as in a constitution shown in FIG. 14.

Figure 15:
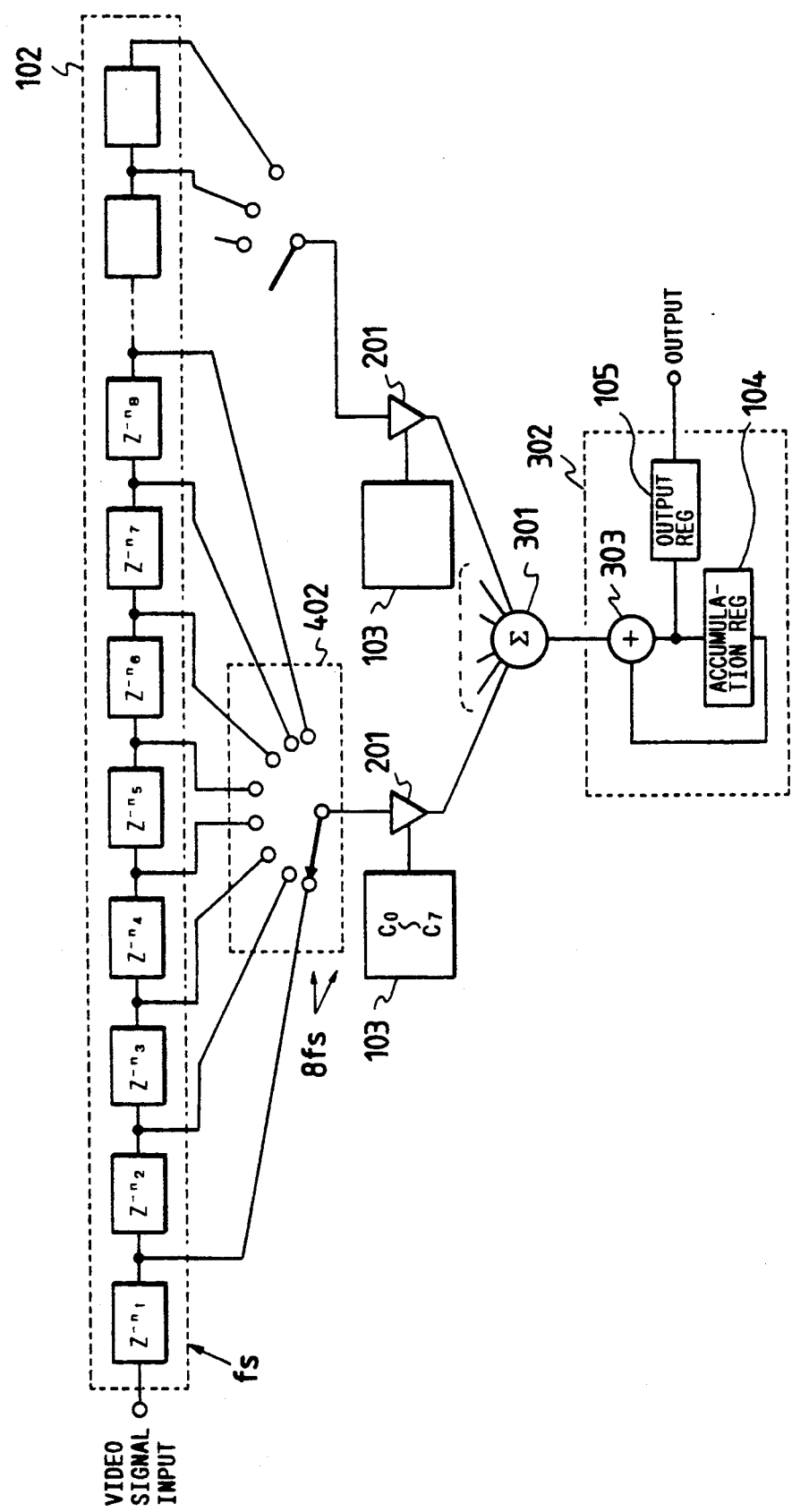
FIG. 15 is a block diagram explaining the principle of eighth and ninth embodiments of the invention.

In a filter shown in FIG. 15, an operation of multiplying by tap gains $C_0-C_7$ is executed using one multiplier 201 in time sharing. A selection circuit 402 connecting a tap output of 8 lines is connected to one input terminal of the multiplier, and a coefficient register 103 storing tap gains corresponding to this is connected to the other input terminal. The output of the multiplier is connected to an adder 301 where a sum of the multiplication results is outputted. An accumulator 302 is connected to the output of the adder, and outputs a signal for ghost canceling.

A selection circuit 402 connecting between an output terminal of every tap and a multiplier 201 operates at the speed of eight times the sampling frequency, and transfers data of a plurality of (eight) output terminals of the shift register 101 to the multiplier sequentially. The multiplier reads out coefficients corresponding to each tap from a register 103 sequentially, and executes multiplication. The multiplication results are summed up by the adder 301. Those outputs are summed up every 8 pieces by the accumulator, and outputted as signals for ghost canceling.

The invention has been explained assuming that the processing speed of the multiplier or the like is eight times the sampling frequency, but this should be determined properly according to the processing capabilities of the multiplier or the like.

Figure 16:
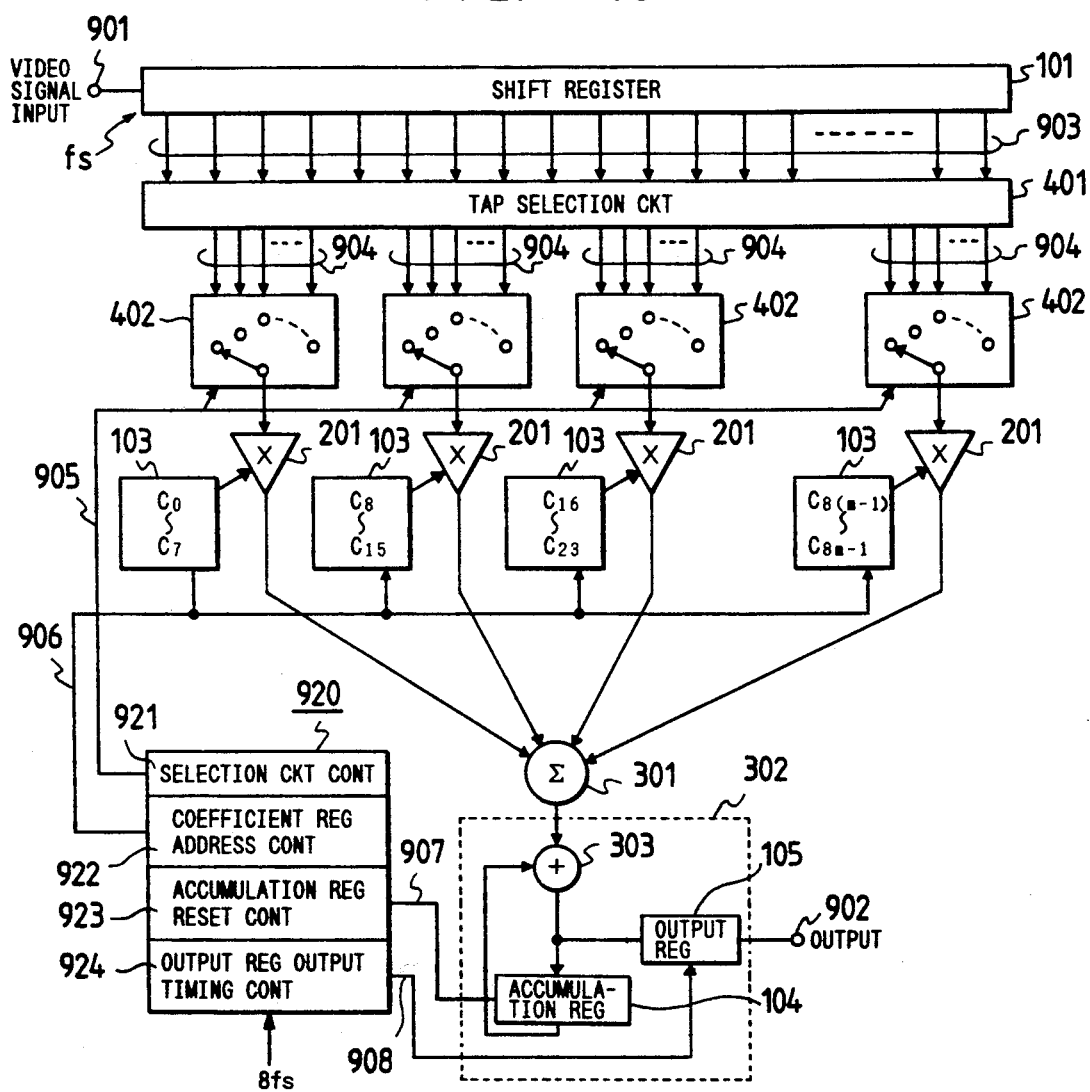
FIG. 16 is a block diagram showing a filter circuit according to an eighth embodiment of the invention.

An eighth embodiment of the present invention will be explained by using FIG. 16. FIG. 16 shows one constitution example of a filter circuit for ghost canceling according to the above-mentioned principle of the present invention.

Input video signals are inputted to a shift register 101 operating at the sampling frequency fs, and are transformed to the time series signals having the sampling interval 1/fs. The time series signals are inputted to a tap selection circuit 401, and allotted to multipliers 201 sequentially in the order from larger tap gains. Eight tap output terminals are allotted to one multiplier 201, and these eight signals are inputted to the multiplier 201 sequentially by a selection circuit 402 operating at the frequency of eight times of the sampling frequency fs. Corresponding tap gain coefficients $C_0-C_7$, $C_8-C_{15}$, . . . , $C_{8(m-1)}-C_{8m-1}$ are previously stored in a coefficient register 103 connected to the multiplier 201, and coefficients corresponding to tap outputs are read out sequentially and multiplication is carried out. The multiplication results are added to each other by an adder 301.

Both the multiplier 201 and the adder 301 operate at the frequency of 8 times the sampling frequency fs, and the operation results are outputted also at 8 fs. An accumulator 302 is composed of an adder 303, an accumulation register 104 and an output register 105, and obtains the operation result of the adder 303, i.e., sum of eight results, and outputs it. Thereby quite the same function as that of the filter circuit for ghost canceling shown in FIG. 13 can be implemented in a very small circuit scale.

Figure 18:
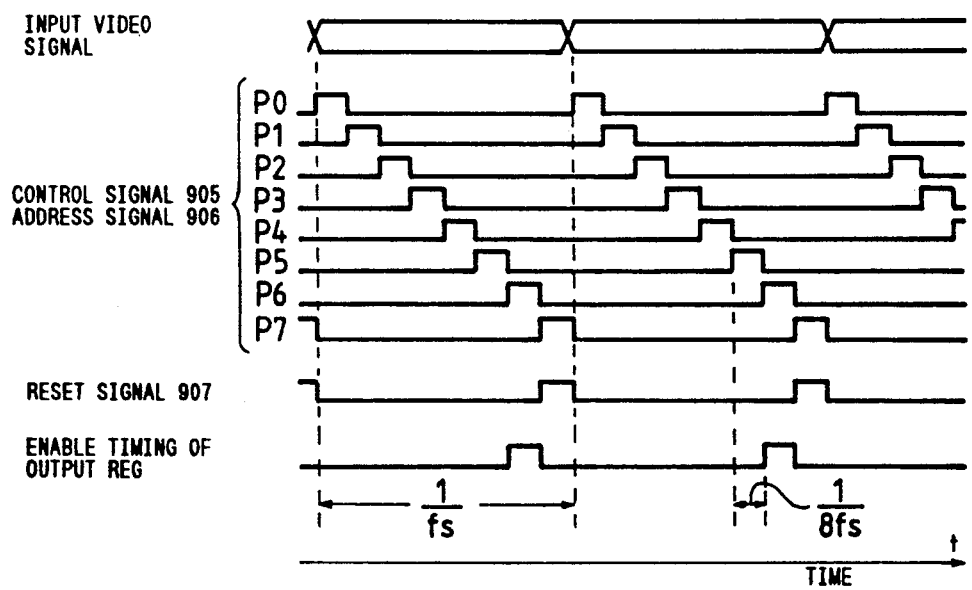
FIG. 18 is a timing chart showing waveforms of signals in the circuits of FIG. 16 and FIG. 17.

In FIG. 16, reference numeral 920 designates a control unit supplying signals to control the operation of each part of the filter. A selection circuit controller 921 supplies a selection circuit 402 with signals 905 controlling operation to select eight contacts in the selection circuit 402 sequentially. A coefficient register address controller 922 supplies address signals 906 to the coefficient register 103 in order that coefficients stored every eight pieces in the coefficient register 103 are supplied to the multiplier 201 sequentially. An accumulation register reset controller 923 supplies the accumulation register 104 with reset signals 907 resetting the accumulation register 104 once a sampling interval 1/fs immediately after outputting the accumulation result. An output register output timing controller 924 supplies the output register 105 with signals 908 commanding the timing to latch the accumulation result to the output register 105 (an enable timing of the output register) when the accumulation of eight times by the adder 303 has been completed. FIG. 18 shows an example of control signals to be produced by the control unit 920.

Figure 17:
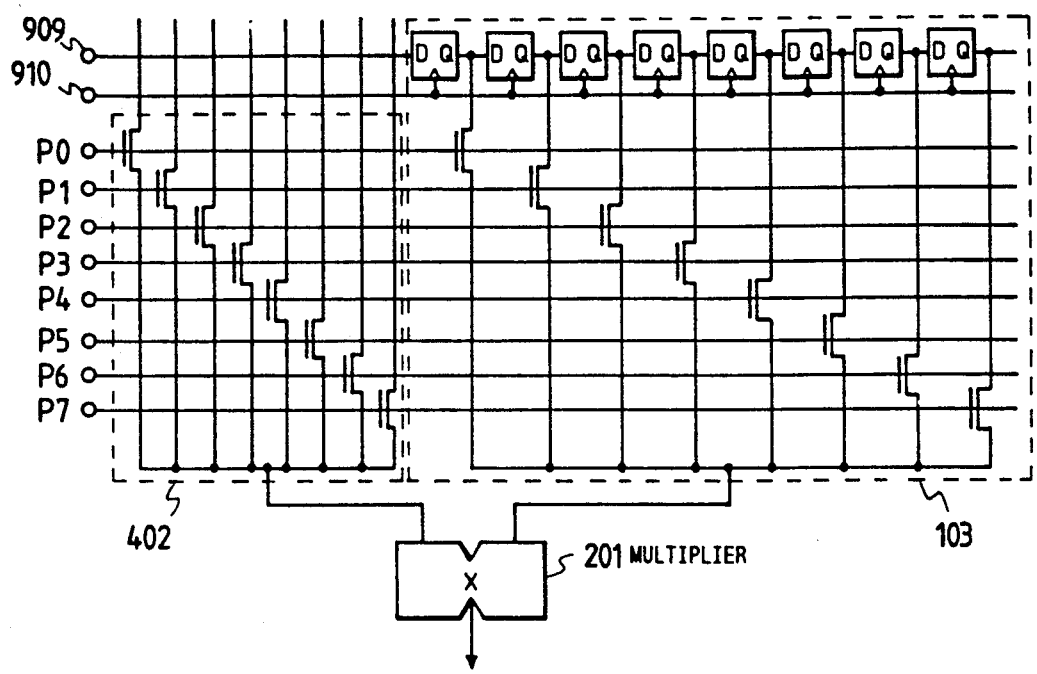
FIG. 17 is a circuit diagram showing an example of a selection circuit and a coefficient register used in the filter circuit in FIG. 16.

FIG. 17 shows an example of constitution of an actual circuit of the selection circuit 402 and the coefficient register 103. The selection circuit 402 is composed of eight switching transistors for one bit, and supplies the multiplier 201 with eight tap outputs sequentially. The coefficient register 103 is composed of a shift register of 8 bits and eight switching transistors connected to each output terminal, and supplies the multiplier 201 with 8 tap gains sequentially. Writing of coefficients into the coefficient register 103 is executed by using a coefficient input terminal 909 serially. At this time, a coefficient write clock is inputted from a terminal 910. Writing of coefficients may be executed while the video signal does not appear in the picture plane, and since adoption of such a circuit constitution does not require an address decoder, it is advantageous in the aspect of the circuit scale.

FIG. 18 shows timing of signals to control the circuits in FIG. 17. The control signals are produced on the basis of operation clocks having the frequency of 8 times the sampling frequency of the inputted video signal. Assuming that the multiplier performs the pipeline operation at 2 stages and the adder and the accumulator perform the pipeline operation at 1 stage, reset timing of the accumulation register 104 and enable timing of the output register 105 are shown.

Figure 19:
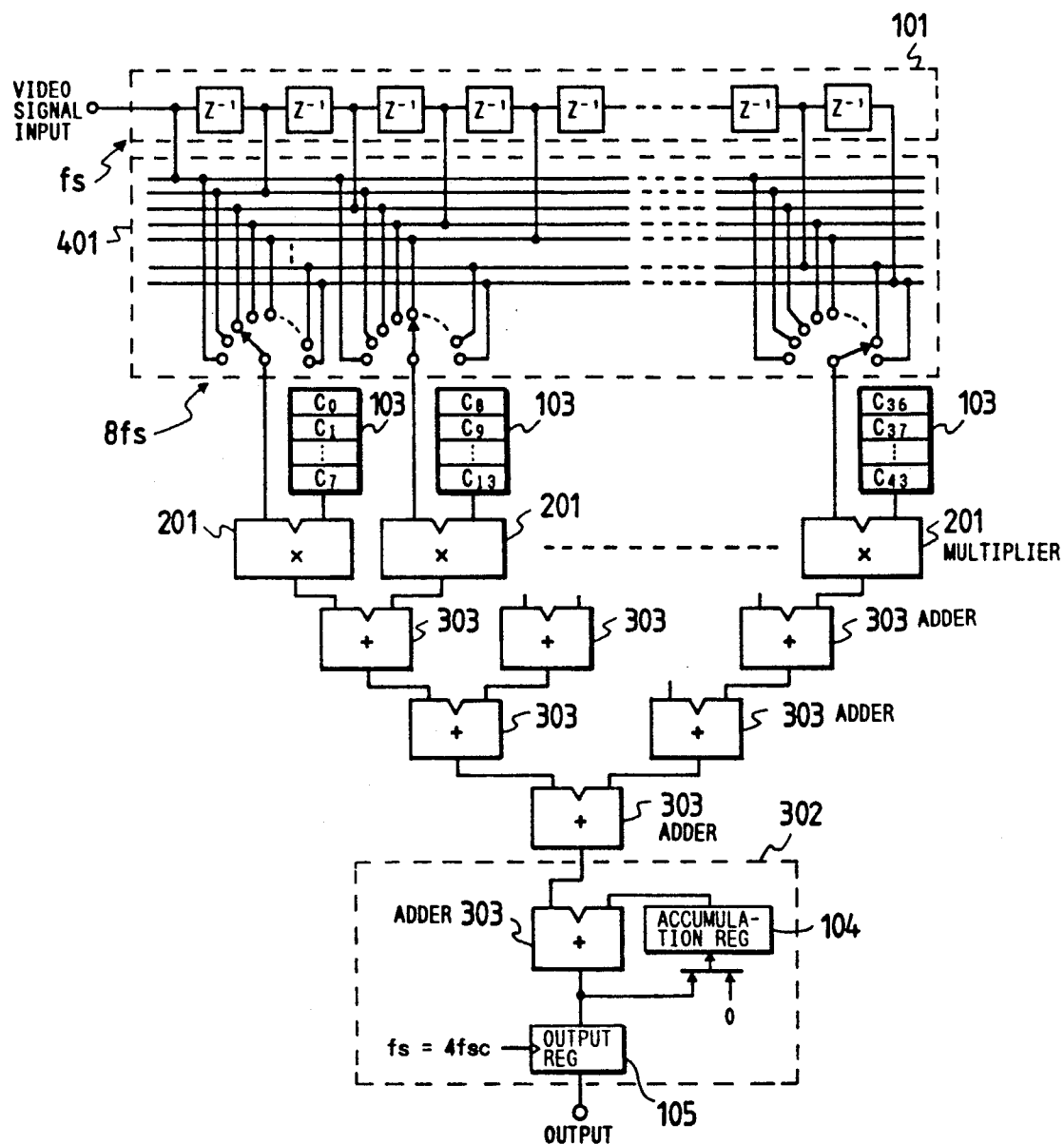
FIG. 19 is a block diagram showing a filter circuit according to a ninth embodiment of the invention.

A ninth embodiment of the present invention will be explained using FIG. 19. FIG. 19 shows another constitution example of a filter circuit for ghost canceling according to the above-mentioned principle of the present invention. To implement function and performance equivalent to those in FIG. 16, a tap selection circuit 401 itself is operated at the frequency 8 fs equal to 8 times the sampling frequency fs of the video signal. In comparison with that shown in FIG. 16, the selection circuit 402 is omitted thereby the circuit scale can be further reduced.

When a ghost interference capable of giving the delay time corresponding to 256 picture elements (256 times the sampling frequency) is assumed, although the 64 multipliers and the 63 adders are required in the filter circuit shown in FIG. 13, the filter circuit can be constituted by eight multipliers, eight adders and eight selection circuits as in eighth embodiment and the ninth embodiment. Thus the circuit scale can be significantly reduced and a filter for ghost canceling in a single chip becomes feasible.

We claim:

1. A filter circuit for processing digital signals of a plurality of bits comprising:
    a plurality of filter circuit units, each for subjecting inputted signals to a filtering process;
    signal input means for dividing a plurality of bits constituting a digital signal to be subjected to a filtering process into a plurality of data in correspondence to said plurality of filter circuit units, each data comprising at least one of the bits, and for inputting the plurality of data as input signals respectively to said plurality of filter circuit units; and
    adding means for weighting outputs of said plurality of filter circuit units by a factor corresponding to places of binary digits respectively, and for adding the weighted outputs to each other.

2. A filter circuit according to claim 1, each of said plurality of filter circuit units comprising:
    a shift register of a plurality of stages for delaying the inputted signals; and
    arithmetic means for performing multiplication of a plurality of output signals outputted respectively from the plurality of stages of said shift register and having delay times being different from each other, by tap gains corresponding to the stages of said shift register respectively, and for calculating a sum of the multiplication results.

3. A filter circuit according to claim 2, said arithmetic means comprising:
    selection means for selecting a plurality of output signals outputted respectively from a plurality of stages of said shift register and having delay times being different from each other, for every predetermined plural numbers sequentially;
    a plurality of multipliers for performing multiplication of a plurality of output signals selected by said selection means, by tap gains corresponding to the stages of said shift register, respectively; and
    an adder for calculating a sum of outputs of said plurality of multipliers, and for accumulating the sums obtained during one sampling interval of the digital signals,
    wherein said arithmetic means operates at the frequency of n times of the sampling frequency of the digital signals, where n is an integer being not less than 2.

4. A filter circuit according to claim 3 wherein said selection means comprises a tap selection circuit for selecting a plurality of output taps derived from the plurality of stages of said shift register respectively.

5. A filter circuit according to claim 3 wherein said adder has a Wallace tree circuit for calculating a sum of outputs of said plurality of multipliers.

6. A filter circuit according to claim 4 wherein said adder has a Wallace tree circuit for calculating a sum of outputs of said plurality of multipliers.

7. A filter circuit according to claim 2, said arithmetic means comprising:
    selection means for selecting a plurality of output signals outputted respectively from the plurality of stages of said shift register and having delay times being different from each other, for every predetermined plural numbers sequentially;

a plurality of partial product generators for generating a plurality of Booth partial products from a plurality of output signals and tap gains corresponding to the output signals respectively; and an adder for calculating a sum of a plurality of Booth partial products generated by said partial product generators, and for accumulating the sums obtained during one sampling interval of the digital signals, wherein said arithmetic means operates at the frequency of times of the sampling frequency of the digital signals, where n is an integer being not less than 2.

8. A filter circuit according to claim 7 wherein said selection means comprises a tap selection circuit for selecting a plurality of output taps derived from the plurality of stages of said shift register respectively.

9. A filter circuit for processing digital signals of a plurality of bits comprising:

a plurality of filter circuit blocks, each having a filter circuit unit for subjecting inputted signals to a filtering process, a shifter for receiving an output from other filter circuit block and for weighting the output by a predetermined factor, an adder for adding an output from said filter circuit unit to an output from said shifter, and a switch for selecting either the output from said filter circuit unit or an output from said adder as output of the filter circuit block; and signal input means for dividing a plurality of bits constituting a digital signal to be subjected to a filtering process into a plurality of data in correspondence to said plurality of filter circuit blocks, each data comprising at least one of the bits, and for inputting the plurality of data as input signals respectively to the filter circuit units within said plurality of filter circuit blocks.

10. A filter circuit according to claim 9, said filter circuit unit comprising:

a shift register of a plurality of stages for delaying the inputted signals; and arithmetic means for performing multiplication of a plurality of output signals outputted respectively from the plurality of stages of said shift register and having delay times being different from each other, by tap gains corresponding to the stages of said shift register, respectively, and for calculating a sum of the multiplication results.

11. A filter circuit for processing digital signals of a plurality of bits comprising:

a plurality of filter circuit units, each having a shift register of a plurality of stages for delaying the inputted signals, and a plurality of multipliers for performing multiplication of a plurality of output signals outputted respectively from the plurality of stages of said shift register and having delay times being different from each other, by tap gains corresponding to the stages of said shift register, respectively;

signal input means for dividing a plurality of bits constituting a digital signal to be subjected to a filtering process into a plurality of data in correspondence to said plurality of filter circuit units, each data comprising at least one of the bits, and for inputting the plurality of data as input signals respectively to said plurality of filter circuit units; and adding means for weighting outputs of said plurality of multipliers within said plurality of filter circuit units by a factor corresponding to places of binary digits respectively, and for calculating a sum of the weighted outputs.

12. A filter circuit according to claim 11 wherein said adding means comprises a Wallace tree circuit.

13. A filter circuit for processing digital signals of a plurality of bits comprising:

a plurality of filter circuit units, each having a shift register of a plurality of stages for delaying the inputted signals, selection means for selecting a plurality of output signals outputted respectively from a plurality of stages of said shaft register and having delay times being different from each other, for every prescribed plural numbers sequentially, and a plurality of multipliers for performing multiplication of a plurality of output signals selected by said selection means, by tap gains corresponding to the stages of said shift register, respectively;

signal input means for dividing a plurality of bits constituting a digital signal to be subjected to a filtering process into a plurality of data in correspondence to said plurality of filter circuit units, each data comprising at least one of the bits, and for inputting the plurality of data as input signals respectively to said plurality of filter circuit units; and adding means for weighting outputs of said plurality of multipliers within said plurality of filter circuit units by a factor corresponding to places of binary digits respectively, for calculating a sum of the weighted outputs, and for accumulating the sums obtained during one sampling interval of the digital signals, wherein said selection means, said plurality of multipliers and said adding means operate at the frequency of n times of the sampling frequency of the digital signals, where n is an integer being not less than 2.

14. A filter circuit according to claim 13 wherein said adding means comprises a Wallace tree circuit.

15. A filter circuit for processing digital signals of a plurality of bits comprising:

a plurality of filter circuit units, each having a shift register of a plurality of stages for delaying the inputted signals, selection means for selecting a plurality of output signals outputted respectively from a plurality of stages of said shift register and having delay times being different from each other, for every predetermined plural numbers sequentially, and a plurality of partial product generators for generating a plurality of Booth partial products from a plurality of output signals selected by said selection means and tap gains corresponding to the output signals respectively;

signal input means for dividing a plurality of bits constituting a digital signal to be subjected to a filtering process into a plurality of data in correspondence to said plurality of filter circuit units, each data comprising at least one of the bits, and for inputting the plurality of data as input signals respectively to said plurality of filter circuit units; and adding means for weighting outputs of said plurality of partial product generators within said plurality of filter circuit units by a factor corresponding to places of binary digits respectively, for calculating a sum of the weighted outputs, and for accumulating the sums obtained during one sampling interval of the digital signals, wherein said selection means, said plurality of partial product generators and said adding means operate at the frequency of n times of the sampling frequency of the digital signals, where n is an integer being not less than 2.

16. A filter circuit according to claim 15 wherein said adding means comprises a Wallace tree circuit.

17. A filter circuit for processing digital signals of a plurality of bits comprising:

a shift register of a plurality of stages to which digital signals of a plurality of bits are inputted;

a bit selection circuit for dividing a plurality of bits constituting each of output signals respectively outputted from the plurality of stages of said shift register and having delay times being different from each other into a plurality of data corresponding to places of binary digits, and for outputting the plurality of data sequentially;

a plurality of multipliers for performing multiplication of data outputted from said bit selection circuit by tap gains corresponding to the stages of said shift register, respectively;

a plurality of shifters for weighting outputs of said plurality of multipliers by a factor corresponding to places of binary digits respectively; and adding means for calculating a sum of outputs of said plurality of shifters, and for accumulating the sums obtained during one sampling interval of the digital signals, wherein said bit selection circuit, said plurality of multipliers, said plurality of shifters and said adding means operate at the frequency of n times of the sampling frequency of the digital signals, where n is an integer being not less than 2.

18. A filter circuit for processing digital signals of a plurality of bits comprising:

a shift register of a plurality of stages to which digital signals of a plurality of bits are inputted;

selection means for selecting a plurality of output signals respectively outputted from the plurality of stages of said shift register and having delay times being different from each other, for every predetermined plural numbers sequentially;

a bit selection circuit for dividing a plurality of bits constituting each of output signals respectively selected by said selection means into a plurality of data corresponding to places of binary digits, and for outputting the plurality of data sequentially;

a plurality of multipliers for performing multiplication of data outputted from said bit selection circuit by tap gains corresponding to the stages of said shift register, respectively;

a plurality of shifters for weighting outputs of said plurality of multipliers by a factor corresponding to places of binary digits respectively; and adding means for calculating a sum of outputs of said plurality of shifters, and for accumulating the sums obtained during one sampling interval of the digital signals, wherein said selection means operates at the frequency of n times of the sampling frequency of the digital signals, and further said bit selection circuit, said plurality of multipliers, said plurality of shifters and said adding means operates at the frequency of m times of the operation frequency of said selection means, where n and m are integers being not less than 2.

19. A filter circuit for processing digital signals of a plurality of bits comprising:

a shift register of a plurality of stages to which digital signals of a plurality of bits are inputted;

a bit selection circuit for dividing a plurality of bits constituting each of output signals respectively outputted from a plurality of stages of said shift register and having delay times being different from each other into a plurality of data corresponding to places of binary digits, and for outputting the plurality of data sequentially;

a plurality of partial product generators for generating a plurality of Booth partial products from data outputted from said bit selection circuit and tap gains corresponding to the stages of said shift register, respectively;

a plurality of shifters for weighting outputs of said plurality of partial product generators by a factor corresponding to places of binary digits respectively; and adding means for calculating a sum of outputs of said plurality of shifters, and for accumulating the sums obtained to places of binary digits respectively; and adding means for calculating a sum of outputs of said plurality of shifters, and for accumulating the sums obtained during one sampling interval of the digital signals, wherein said bit selection circuit, said plurality of partial product generators, said plurality of shifters and said adding means operate at the frequency of n times of the sampling frequency of the digital signals, where n is an integer being not less than 2.

20. A filter circuit for processing digital signals of a plurality of bits comprising:

a shift register of a plurality of stages to which digital signals of a plurality of bits are inputted;

selection means for selecting a plurality of output signals respectively outputted from a plurality of stages of said shift register and having delay times being different from each other, for every predetermined plural numbers sequentially;

a bit selection circuit for dividing a plurality of bits consisting each of output signals respectively selected by said selection means into a plurality of data corresponding to places of binary digits, and for outputting the plurality of data sequentially;

a plurality of partial product generators for generating a plurality of Booth partial products from data outputted from said bit selection circuit and tap gains corresponding to the stages of said shift register, respectively;

a plurality of shifter for weighting outputs of said plurality of partial product generators by a factor corresponding to places of binary digits respectively; and adding means for calculating a sum of outputs of said plurality of shifters, and for accumulating the sums obtained during one sampling interval of the digital signals, wherein said selection means operates at the frequency of n times of the sampling frequency of the digital signals, and further said bit selection circuit, said plurality of partial product generators, said plurality of shifters and said adding means operate at the frequency of m times of the operation frequency of said selection means, where n and m are integers being not less than 2.

21. A transversal filter which is used for a unit canceling ghost component from an inputted digital video signal in that an inputted digital video signal and a ghost canceling signal obtained from the digital video signal subjected to a filtering process are added to each other, said transversal filter comprising:

a shift register of a plurality of stages for delaying the inputted digital video signals;

a plurality of multipliers for performing multiplication of a plurality of output signals respectively outputted from output terminals of a plurality of stages of said shift register and having delay times being different from each other by tap gains corresponding to the stages of said shift register, respectively;

selection means for selecting the connection between output terminals of a plurality of stages of said shift register and input terminals of said plurality of multipliers at the frequency of n times of the sampling frequency of the digital video signals;

coefficient storage means for supplying said plurality of multipliers with coefficients representing tap gains corresponding respectively to output signals of said shift register supplied from output terminals of a plurality of stages of said shift register to input terminals of said plurality of multipliers, in response to the selection operation of said selection means; and adding means for calculating a sum of outputs of said plurality of multipliers, and for accumulating the sums obtained during one sampling interval of the digital video signals, wherein said plurality of multipliers and said adding operate at the frequency of n times of the sampling frequency of the digital video signals, where n is an integer being not less than 2.

* * * * *